United States Patent [19]

Holm-Kennedy

[11] Patent Number: 4,916,505
[45] Date of Patent: Apr. 10, 1990

[54] COMPOSITE UNIPOLAR-BIPOLAR SEMICONDUCTOR DEVICES

[75] Inventor: James W. Holm-Kennedy, Laie, Hi.

[73] Assignee: Research Corporation of the University of Hawaii, Honolulu, Hi.

[21] Appl. No.: 699,375

[22] Filed: Feb. 7, 1985

Related U.S. Application Data

[63] Continuation of Ser. No. 231,023, Feb. 3, 1981, abandoned.

[51] Int. Cl.$^4$ .................... H01L 27/02; H01L 27/14
[52] U.S. Cl. .................... 357/43; 357/23.1; 357/30; 357/34; 357/46; 357/41; 357/20
[58] Field of Search .................... 357/43, 30, 46, 23.1, 357/23.12, 23.14, 34, 91, 41, 20, 92

[56] References Cited

U.S. PATENT DOCUMENTS

| | | |
|---|---|---|
| 2,929,999 | 3/1960 | Bradley et al. . |
| 3,112,411 | 11/1963 | Cook, Jr. et al. . |
| 3,397,326 | 8/1968 | Gallagher et al. . |
| 3,401,319 | 9/1968 | Watkins . |
| 3,466,511 | 9/1969 | Lin . |
| 3,649,843 | 3/1972 | Redwine et al. . |
| 3,667,115 | 6/1972 | Barson et al. . |
| 3,826,926 | 7/1974 | White et al. ........................ 357/24 |
| 3,865,649 | 2/1975 | Beasom . |
| 3,920,489 | 11/1975 | Ogura . |
| 3,986,195 | 10/1976 | Arai ........................ 357/30 |
| 4,016,596 | 4/1977 | Magdo et al. . |
| 4,027,319 | 5/1977 | Borrello et al. ........................ 357/30 |
| 4,044,452 | 8/1977 | Abbas et al. . |
| 4,057,819 | 11/1977 | Owen et al. ........................ 357/30 |
| 4,087,833 | 5/1978 | Tseng ........................ 357/30 |
| 4,097,888 | 6/1978 | Russell ........................ 357/46 |
| 4,143,392 | 3/1979 | Mylroie . |
| 4,237,472 | 12/1980 | Hollingsworth . |
| 4,255,671 | 3/1981 | Nonaka et al. ........................ 357/43 |
| 4,344,081 | 8/1982 | Pao et al. ........................ 357/43 |
| 4,377,817 | 3/1983 | Nishizawara et al. ........................ 357/41 |
| 4,405,935 | 9/1983 | Baji et al. ........................ 357/30 |

Primary Examiner—J. Carroll
Attorney, Agent, or Firm—James Creighton Wray

[57] ABSTRACT

A composite unipolar-bipolar semiconductor device in which a sourceless field-effect transistor structure is fabricated upon the outer face of one member of a junction diode structure. In some embodiments the gate portion of the sourceless field-effect transistor structure is at least partially transparent to radiation of at least part of the electro-magnetic spectrum. In some embodiments radiation sensitive material is deposited upon the gate portion of the sourceless field-effect transistor structure.

3 Claims, 1 Drawing Sheet

COMPOSITE UNIPOLAR-BIPOLAR SEMICONDUCTOR DEVICES

This application is a continuation of application Ser. No. 231,023, filed 2/3/81, now abandoned.

BACKGROUND OF THE INVENTION

1. Field of the Invention

The present invention relates to semiconductor devices, and more particularly to composite unipolar-bipolar semiconductor devices.

2. Description of the Prior Art

Composite unipolar-bipolar semiconductor devices are found in the prior art. Some of these prior art devices consist merely of electrically isolated field-effect transistors and bipolar junction transistors, which for compactness or ease of fabrication constitute parts of the same unitary semiconductor structure. Other ones of such prior art devices consist of field-effect transistors and bipolar junction transistors which, rather than being mutually completely isolated, are interconnected through portions of the same unitary semiconductor structures of which they are parts. Further, it is known in the prior art to provide composite unipolar-bipolar semiconductor devices the major elements of which are symmetrical about a common axis. In general, however, the composite unipolar-bipolar semiconductor devices of the prior art can be represented by equivalent circuits made up of one or more field-effect transistors and one or more bipolar junction transistors, interconnected or isolated. For this reason, the composite unipolar-bipolar semiconductor devices of the prior art do not in general provide new and desirable device characteristics and capabilities which are not available in simple combinations of interconnected field-effect transistors and binary junction transistors.

3. Related Art

The following U.S. Letters Patent contain information which is or might be held to be material to the examination of this patent application: 2,929,999; 3,112,411; 3,397,326; 3,401,319; 3,466,511; 3,649,843; 3,667,115; 3,865,649; 3,920,484; 4,016,596; 4,044,452; 4,143,392; and 4,237,472. No representation is made with respect to these patents other than that they are material or might be held to be material to the examination of this patent application. Particularly, no representation is made that any of these patents constitute prior art with respect to this patent application, or that a search has been made, or that no art more relevant than these patents exists. A copy of each of these patents was filed in the Patent and Trademark Office with this application.

SUMMARY OF THE INVENTION

It is an object of my invention to provide novel composite unipolar-bipolar semiconductor devices having characteristics and capabilities not achieved in the composite unipolar-bipolar semiconductor devices of the prior art.

It is yet another object of my invention to provide novel composite unipolar-bipolar semiconductor devices having useful application in many arts, e.g., the arts of photodetection, mixing, logic, current amplification, voltage amplification, waveshaping, voltage limiting, current limiting, frequency multiplication, and switching.

It is a further object of my invention to provide unique four terminal semiconductor devices.

It is an additional object of my invention to provide unique composite unipolar-bipolar semiconductor devices having non-linear operating characteristics which are particularly useful in mixing, parametric amplification, frequency multiplication and conversion, etc.

It is a yet further object of my present invention to provide novel merged transistor devices finding particular application where compactness is of importance.

It is a still further object of my invention to provide novel composite unipolar-bipolar semiconductor devices capable of operating as optical repeater devices, optical frequency conversion devices, and optical pumping devices, including lasing devices.

In accordance with a particular feature of my invention, a sourceless field-effect transistor structure is fabricated upon the outer face of one member of a junction diode structure, so that the combination acts as a bipolar junction transistor having the channel of the sourceless field-effect transistor as its collector or emitter. Alternatively, of course, the junction diode structure may be considered to act as the source of the sourceless field-effect transistor structure.

In accordance with another feature of my invention, the channel of the sourceless field-effect transistor structure, surrounds the drain thereof and is discoid in form and concentric with the drain, resulting in desirable, controllable, nonlinear operating characteristics of the kind which are useful in mixing, parametric amplification, and frequency multiplication and conversion.

In accordance with a further feature of my invention, the gate electrode and gate insulator of a composite unipolar-bipolar semiconductor device of my invention may be made at least partially transparent to radiation of at least part of the electromagnetic spectrum, thereby rendering the current through the device controllable by impingent radiation.

In accordance with a further feature of my invention, composite unipolar-bipolar semiconductor devices of my invention having transparent gate electrodes and gate insulators may be caused to emit radiation the intensity of whichis controllable by signals applied to the gate or base contacts thereof.

In accordance with yet another feature of my invention, a composite unipolar-bipolar semiconductor device of my invention may be provided with separate terminals connected respectively to both parts of the junction diode structure and to the gate and drain of the sourceless field-effect transistor structure, whereby to provide a useful four terminal device characterized by a variety of useful electronic functions.

Other objects and features of my invention will in part be obvious and will in part appear hereinafter.

My invention, accordingly, comprises the features of construction, combinations of elements, and arrangements of parts which will be exemplified in the constructions hereinafter set forth, and the scope of my invention will be indicated in the appended claims.

For a fuller understanding of the nature and objects of my invention, reference should be had to the following detailed description, taken in connection with the accompanying drawings.

DESCRIPTION OF THE PREFERRED EMBODIMENTS

Figure 1:
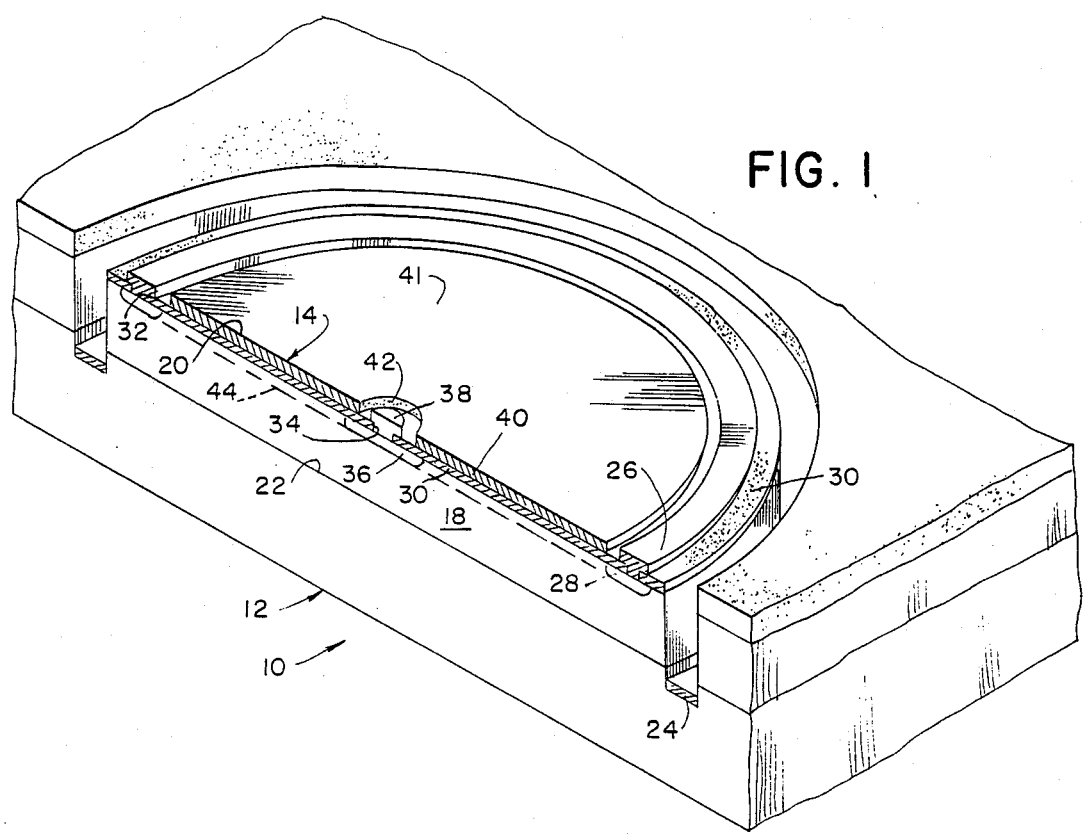
FIG. 1 is an isometric view, partly in section, of a semiconductor device embodying my invention.

Referring now to FIG. 1, there is shown by way of example an N-channel composite unipolar-bipolar semiconductor device 10 constructed in accordance with a preferred embodiment of my invention.

It is to be understood, however, that my invention is not limited to the preferred embodiment of FIG. 1, but rather embraces many other embodiments, both described herein and not described herein, which will occur to those having ordinary skill in the art when informed by the present disclosure. For example, any suitable semiconducting material known to those having ordinary skill in the art may be used in fabricating embodiments of my invention other than the silicon used in fabricating the preferred embodiment of FIG. 1. Further, the sourceless field-effect transistor portion of the device of FIG. 1 may be replaced in other embodiments of my invention with sourceless depletion-mode insulated gate field-effect transistor structures or sourceless junction field-effect transistor structures. Yet further, in contradistinction to the teachings of FIG. 1, the sourceless field-effect transistor portions of certain embodiments of my invention may be fabricated upon the N-conductivity parts of their associated junction diode portions. Also, in accordance with further teachings of my invention, the gate and gate insulator structures of certain embodiments of my invention may be made at least partially transparent to radiation of at least part of the electromagnetic spectrum. Thus, it will be understood that certain embodiments of the composite unipolar-bipolar semiconductor device of my invention are suitably fabricated to act as photodetectors, and that certain other embodiments of my invention are suitably fabricated to act as light emissive devices.

Referring again to FIG. 1, it will be seen that the N-channel composite unipolar-bipolar semiconductor device 10 thereof may be thought of as comprising two principal portions or sections, i.e., a junction diode section 12 and a sourceless field-effect transistor section 14.

As seen in FIG. 1, junction diode section 12 comprises a lower semiconductor body portion 16 of N-type silicon, upon which an upper semiconductor body portion or epitaxial layer 18 of P-type conductivity may be grown, upper semiconductor body portion or epitaxial layer 18 having a planar top or major surface 20.

In the well-known manner in such cases, a rectifying junction 22, sometimes called a PN junction or semiconductor junction, exists between body portion 16 and body portion 18.

Junction diode section 12 further comprises an annular contact 24, fabricated by well-known metallizing techniques, by means of which electrical connection between external circuitry and lower semiconductor body portion 16 may be provided. Junction diode section 12 further comprises an annular contact 26, provided by a suitable metallizing process in the well-known manner. Immediately below annular contact 26, and conductivity connected thereto throughout their common surface, is an annular contact zone 28 of P-type conductivity, which is of high conductivity, and may be fabricated in upper semiconductor body portion 18 by diffusion.

Thus, it will be understood by those who have ordinary skill in the art, informed by the present disclosure, that both lower semiconductor body portion 16 and upper semiconductor body portion 18, respectively, are provided with annular contacts 24, 26, whereby they may, by intermediate expedients of well-known type, be independently connected to a suitable external circuit. In the design of circuits for the utilization of the device 10, annular contacts 24 and 26 will be considered to be two of the four terminals of device 10.

Referring again to FIG. 1, it will be seen by those having ordinary skill in the art, informed by the present disclosure, that sourceless field-effect transistor section 14 resembles in general the gate structure and the drain structure of an enhancement mode field-effect transistor.

As will also be evident to those having an ordinary skill in the art, informed by the present disclosure, the device 10 of FIG. 1 is unprovided with the usual source structure adapted to cooperate with the just-described gate structure and drain structure.

As seen in FIG. 1, sourceless field-effect transistor section 14 comprises an insulating layer 30, disposed upon the top or major face 20 of upper semiconductor body portion 18, and there fabricated in the well-known manner from, e.g., silicon dioxide.

As also seen in FIG. 1, an annular opening 32 passes through insulating layer 30, and the lower portion of annular contact 26 extends through opening 32 into contact with annular contact zone 28.

A central circular opening 34 also passes through insulating layer 30.

Located directly below opening 34 is the drain region 36 of upper semiconductor body portion 18. Drain region 36 is of opposite conductivity type from the immediately adjacent region of upper semiconductor body portion 18, i.e., is of N-type conductivity. Drain region 36 may be produced in upper semiconductor body portion 18, e.g., by ion implantation, and is fabricated so as to be of relatively high conductivity. Drain region 36 is preferably substantially circular in its periphery, i.e., is essentially discoid, and its diameter is substantially larger than the diameter of opening 34 in insulating layer 30, whereby it extends outwardly directly beneath the central portion of insulating layer 30.

A drain contact 38, fabricated in the well-known manner, extends through opening 34 and conductively contacts drain region 36. Drain contact 38 is provided with a flat head portion the outer edges of which overlie insulating layer 30.

In designing circuits for the utilization of device 10, drain contact 38 is taken to be one of the four terminals of device 10.

A metallic gate electrode 40 having a central opening 42, and a circular periphery, is deposited or otherwise produced on insulating layer 30 by a well-known technique. In the designing of circuits for the utilization of device 10, gate electrode 40 is considered to be one of the four terminals of device 10.

As will be evident to those having ordinary skill in the art, informed by the present disclosure, each of the four terminals, 24, 26, 38, and 40 of device 10 may be provided with conductive connecting means (not shown) fabricated by well-known techniques, whereby it may be directly, conductively connected to another circuit element contained in the same package containing device 10, or to a corresponding external terminal of the package in which device 10 is contained.

As will be evident to those having ordinary skill in the art, informed by the present disclosure, an N-channel 44 will be produced directly beneath major surface 20 of semiconductor body portion 18 when suitable operating potentials are applied to gate 14 and the other terminals of device 10.

In other embodiments of the present invention, e.g., depletion-mode insulated gate embodiments, an actual channel, produced, for example, by diffusion into major surface 20, will be found directly below insulating layer 30, within the uppermost region of semiconductor body portion 18.

Since channel 44 is not an actual chamber, but rather an induced channel, the region within semiconductor body portion 18 immediately below insulating layer 30, which sometimes may be occupied by a channel induced by a suitable voltage on gate electrode 40, will be denominated herein by the term "channel region", and designated by the reference numeral 44, whether occupied by an induced channel or not.

OPERATION

Assuming the sourceless field-effect transistor section 14 of FIG. 1 to be a sourceless metal-oxide semiconductor field-effect transistor (MOSFET) in which insulating layer 30 is a layer of silicon dioxide and gate electrode 40 is a layer of deposited aluminum, the operation of device 10 may be understood as follows.

Sourceless field-effect transistor section 14 can be considered to act as the collector of a transistor comprising itself and junction diode section 12. In other words, sourceless field-effect transistor section 14 can be considered as a distributed collector for charge transported across semiconductor body portion 18 from semiconductor body portion 16. In accordance with this conception of device 10, then, device 10 may be considered to be a bipolar junction transistor having a distributed MOSFET collector, the collector contact of which transistor is drain contact 38.

Alternatively, device 10 may be conceived to be a MOSFET with a distributed bipolar junction transistor source, i.e., junction diode section 12.

If the sourceless field-effect transistor section 14 is biased into inversion by the application to gate electrode 40 of a potential which is positive with respect to the respective potentials applied to contacts 26 and 38, inducing a channel 44 immediately beneath the upper surface of semiconductor body portion 18 (cf., e.g., *Transistor and Integrated Electronics* by Milton S. Kiver, Fourth Edition, McGraw-Hill Book Company, New York, 1976, page 134), this induced N-channel operates as the collector with respect to semiconductor body portion 18 acting as the associated base, and semiconductor body portion 16 acting as the associated emitter.

Thus, current injected by "emitter" 16 is transported across "base" 18 to the associated "collector" 44, i.e., the induced N-channel 44.

In the operation of device 10, then, electrons cascade down the collector potential drop and find themselves in induced N-channel 44. These electrons are then carried along induced N-channel 44 to drain 36, whereafter they leave device 10 via drain contact 38.

As will now be understood by those having ordinary skill in the art, informed by the present disclosure, the passage of these current carriers (electrons) along respective radii of channel 44, toward drain 36, results in a potential drop along each radius of channel 44. This radial voltage drop will be called herein the "channel voltage drop". When the channel voltage drop is small, the bipolar junction transistor characteristics of device 10, i.e., the characteristics of device 10 from contacts 24, 26, and 38 taken as the emitter, base, and collector contacts, respectively, of a conventional bipolar junction transistor and having conventional bipolar junction transistor test potentials applied thereto, are similar to the corresponding characteristics of a conventional bipolar junction transistor in forward gain operation (see e.g., FIG. 2).

Figure 2:
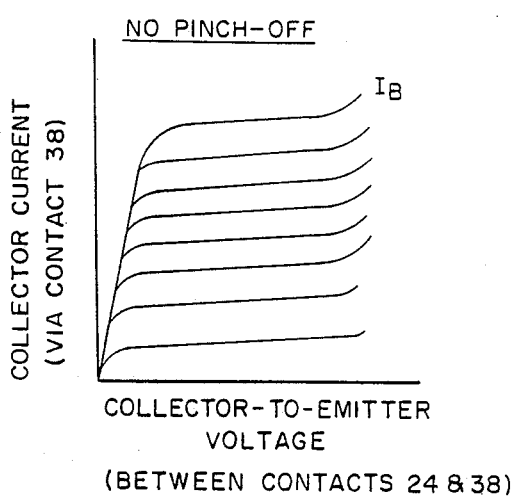
FIG. 2 is an idealized representation of a collector (drain) characteristic curve family of a semiconductor device embodying my invention, operated in a linear mode of operation.
Figure 3:
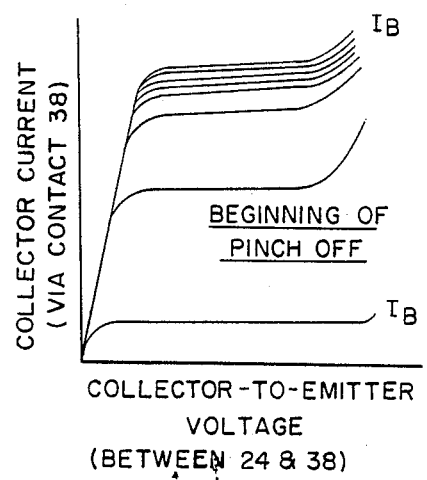
FIG. 3 is an idealized representation of a collector (drain) characteristic curve family of a semiconductor device embodying my invention, operated in a non-linear mode of operation.

If the current in channel 44 is sufficiently high to produce a channel voltage drop which causes field-effect transistor pinch-off (see Kiver, cited supra, pages 135 and 136), to begin to set in, the drain (collector) current from drain contact 38 begins to be limited, and a compression of the bipolar junction characteristics of device 10 is manifested (FIG. 3, which compare with FIG. 2).

As may be demonstrated empirically, the degree of compression of the bipolar junction transistor characteristics of the device 10 of FIG. 1 is dependent upon the magnitude of the potential drop (radial) along induced channel 44, i.e., the degree of field-effect transistor pinch-off ocurring in induced channel 44.

A small increase in the collector (drain) current issuing from the drain contact 38 results in further compression of these bipolar junction transistor characteristics.

Thus, there is a non-linear dependence of the collector (drain) current issuing from drain contact 38 upon the base current entering contact 26 and upon the gate voltage applied to gate electrode 40. The degree of this non-linearity may be empirically shown to depend upon the nature of channel 44, i.e., upon the resistance of channel 44 and the relationship of that resistance to the channel voltage, and also upon the shape of the gate (circular, elliptical, etc.), the (radial) length of the gate, or mean radial length of the gate if the gate is non-circular, etc.

Thus, it will be seen by those having ordinary skill in the art, informed by the present disclosure, that the devices of many embodiments of my invention are characterized by non-linearities in their bipolar junction transistor characteristics, which non-linearities are dependent upon gate voltage, base current, and collector (drain) current.

It will also be evident to those having ordinary skill in the art, informed by the present disclosure, that these non-linearities also depend upon the geometries of these devices, and particularly upon the geometries of the sourceless field-effect transistor sections of these devices, since the geometry of the channel and its associated gate controls the amount of current constriction in the channel, and thereby controls the potential drop per unit length (radial) in any region of the channel, and thereby the dependence of pinch-off on collector (drain) current and gate voltage.

In these embodiments of my invention, the sharpness of the pinch-off and therefore the degree of non-linearity can be affected by the geometry of the device as well as by the gate voltage, the collector (drain) current, and the base (semiconductor body portion 18) current.

In these embodiments of my invention an increase in the magnitude of the gate voltage increases the degree of inversion and moves the onset of pinch-off to a higher collector (drain) current.

As is well-known to those having ordinary skill in the electronic device art, non-linear behavior is useful in many fields of application such as frequency multiplication, mixing, and parametric amplification. Thus, as now will be obvious to those having ordinary skill in the art, devices embodying my invention have broad application in such fields as frequency multiplication, mixing, and parametric amplification, because desired non-linearities can be provided in such devices in accordance with the teachings of my invention both by employing suitable channel and gate geometries and by employing suitable biasing.

As will also be evident to those having ordinary skill in the art, informed by the present disclosure, devices embodying my invention, including device 10 of FIG. 1, may be "turned off", i.e., the collector (drain) current interrupted, by the simple expedient of biasing the gate electrode in such a way that cahnnel 44 is operating in the accumulation mode, rather than in the just described inversion mode.

Thus, it will be seen from the above by those having ordinary skill in the art that many devices of my invention can be operated in a bipolar transistor-like mode, a non-linear mode, a field-effect transistor-like mode, and as a switch. When operated as a switch these devices embodying my invention can be switched by means of the base current, the collector (drain) current, and the gate voltage.

As will also be understood by those having ordinary skill in the art, informed by the present disclosure, devices embodying my invention operate as switches at zero steady state current, i.e., without DC gate current. Such devices also operate to limit collector current controlled by a single high-impedance gate voltage terminal. As will further be apparent to those having ordinary skill in the art, informed by the present disclosure, devices embodying my invention provide various mechanisms for gain, which can be employed cumulatively. These gain mechanisms include the conventional gain mechanisms of field-effect transistors and bipolar junction transistors. A further gain mechanism available in devices embodying my invention is parametric gain. Combinations of these gain mechanisms characteristic of devices embodying my invention can result in a multiplication of gains, thereby increasing the overall gain of the device.

Device 10 of FIG. 1 may also be operated with the sourceless field-effect transistor section 14 and drain 36 acting as the emitter and the lower semiconductor body portion 16 acting as the collector. In this mode of operation the injection efficiency (and thus the gain) can be controlled or affected by the gate voltage, the drain voltage (with respect to the base voltage), and the surface recombination velocity of the surface. This mode of operation also has circuit and photodetector applications. Other embodiments of my invention than that specifically shown in FIG. 1 may be operated in this mode.

In addition to the voltage-controlled or current-controlled embodiments of my invention described hereinabove, my invention further embraces photosensitive devices which provide photodetection with gain.

Photosensitive embodiments of my invention incorporate transparent gate structures, which may comprise e.g., ITO (InSnO), semitransparent aluminum, or some other transparent conducting or semiconducting material.

As will be obvious to those having ordinary skill in the art, informed by the present disclosure, photosensitive devices of my invention exhibit more than conventional phototransistor behavior. The conventional phototransistor principally collects photogenerated carriers in the reverse-biased collector depletion region. Charges delivered to the base bias it with respect to the emitter to force injection of charge carriers from the base to the emitter.

In the photosensitive devices of my invention, because the emitter-base junction is designed with a high injection efficiencdy, a much larger current is forced (injected) from the emitter to the base, across which it diffuses to be collected. This mechanism provides multiplication or gain of the photogenerated carriers. It is a particular advantage of my invention to use the impinged surface as the collector, because this is the region of maximum photoabsorption.

As will now be evident to those having ordinary skill in the art, the photosensitive devices of my invention are specially adapted to a particularly advantageous mode of operation, which constitutes and advantage of my invention additional to the advantage thereof just described.

By the employment of this advantageous mode of operation, it is possible to improve upon the gain of the conventional phototransistor.

This advantageous mode of operation, which is a characteristic feature of my invention, consists in operating a photosensitive device embodying my invention in the non-linear region thereof by appropriately setting the values of gate voltage, base current (entering contact 26) and/or collector (drain) current so that the device is beginning to pinch off. In this manner, a major part of the maximum bipolar transistor gain can be maintained, e.g., 50 per cent of the maximum bipolar transistor gain, and the non-linearity produced by proper selection of gate voltage, etc., may further be used to provide parametric gain, as well. The overall gain of a photosensitive device embodying my invention when operated in accordance with this advantageous mode of operation may be approximately one half the product of the maximum bipolar junction transistor gain and the parametric gain.

Another advantageous mechanism inherent in devices embodying the present invention achieves added gain by photovoltage modulation of the channel and emitter.

As is well-known to those having ordinary skill in the art, photogenerated carriers (electron hole pairs) can bias a junction, as for example in the generation of the open circuit voltage of a solar cell. In the case of a field-effect transistor, this photobias can modulate the channel conductance. Such modulation modulates the field-effect transistor drain current, and can exhibit gain in the usual (conventional) photo-FET amplification mode of operation. Further, if a photosensitive device embodying my invention is operating in the non-linear region, the drain current will exhibit a non-linear behavior due to the field-effect transistor bias photomodulation. (The operating point may be controlled, e.g., by base current and gate voltage). Due to this operational feature of photosensitive devices of my invention, field-effect transistor gain as well as other gain mechanisms may be utilized. Optimally utilizing these available gain mechanisms, the total gain will be the product of the conventional photo-bipolar junction transistor gain, the parametric gain, and the sum of the conventional field-effect transistor gain and the additional gain due to the channel photovoltage modulation. This overall gain is thus potentially much larger than the conventional photo-bipolar junction transistor gain.

As will be obvious to those having ordinary skill in the art, informed by the present disclosure, the non-linear properties of devices embodying my invention, as described hereinabove, may be used to generate IF (intermediate frequency) signals which can be amplified by associated narrow band IF high-gain amplifiers. This mode of employing devices of my invention, which itself constitutes a feature of my invention, provides very high gain and, through the narrow band filter of the amplifier, broad rejection of noise, thus providing a good signal-to-noise ratio. Various modes of signal modulation are available by the employment of the four terminal devices of my invention. (For example, the local oscillator may be applied to the base terminal 26 or to the gate electrode 40). The just described mode of operation of devices embodying my invention, which itself constitutes a part of my invention, applies to the operation of both the voltage-controlled devices embodying my invention and the photosensitive devices embodying my invention. For example, as a photodetector, the IF signal can be amplified with a high gain IF amplifier at the IF frequency, thus suppressing much of the noise inherent in such devices.

Another advantageous mode of employing devices embodying my invention, which mode itself constitutes a part of my invention, is the application of a fixed frequency ($f_o$) to the gate electrode while at the same time a different, preferably information-bearing, signal is applied to the base or upper semiconductor body portion. Said different signal may, for example, be photoflux of arbitrary wave shape impingent upon the transparent field-effect transistor gate structure of a photosensitive device embodying my invention. This advantageous mode of operation of my invention, as applied to a photosensitive device of my invention in the manner just described, provides narrow band high gain amplification of the photosignal by means of a narrow band amplifier operating at frequency $f_o$ with noise rejection or suppression at other frequencies.

Another advantageous mode of operating devices embodying my invention, which is itself a part of my invention, is the operation of a device of my invention as a frequency multiplier, making use of the non-linear region of operation hereinabove described as a characteristic feature of my invention. In this mode of operation, the device of my invention so operated may, on the one hand, simply multiply the input frequency or, on the other hand, the multiplied input frequency may be used as the detected signal, e.g. in photodetector applications of photosensitive devices embodying my invention. In accordance with this mode of operation of my invention, the operating point may be chosen through selection of base current and gate voltage, to provide, e.g., almost no third harmonic. With an additional signal (electrical or of photoorigin) the third harmonic amplitude would be increased (through change in operating point and therefore change in the non-linear characteristic of the device of my invention being employed).

Another class of embodiments of my invention is constituted by the devices embodying my invention which are adapted to detect far infrared (FIR) radiation. Devices embodying my invention may be adapted to the detection of FIR by those having ordinary skill in the art, informed by the present disclosure. In one FIR detector embodiment of my invention, where the sourceless field-effect transistor section is a sourceless junction field-effect transistor structure, deep traps, e.g., deep donors, may be introduced. If, for example, the base region (upper semiconductor body portion) is lightly doped P-type of acceptor-doping concentration $N_a$, diffusion of deep donor concentration $N_{dd}$ converts the channel to N-type although, in this case, the channel is highly resistive. Photons incident on the channel with energy $E_c-E_{dd} < h\nu < E_g$ ionize the traps thereby altering the channel resistance and affecting $I_d$ ($I_c$). (Here $E_{dd}$ is the ionization energy of the deep trap, $E_c$ is the conduction band edge, h is Planck's constant and is the light frequency.)

As will now be evident to those having ordinary skill in the art, informed by the present disclosure, the gain mechanisms and combinations of gain mechanisms described hereinabove, which are characteristic features of my invention, may be employed in FIR detectors embodying my invention as described immediately above, whereby to provide photodetection and photomultiplication (internal gain) at photon energies less than the band gap. The lowest detectable photon energy which may be detected in this manner is . By selection of the trapping impurity, this lower limit can be controlled. For shallow traps, the device can be operated at cryogenic temperatures to assure controlled condensation on the donor sites.

A mode of operating certain FIR detectors embodying my invention, which mode of operation itself is a part of my invention, consists in using the junction field-effect transistor channel as the emitter and affecting the device performance via photosustained channel free carrier concentration.

Another embodiment of my invention which is capable of infrared detection comprises a photosensitive material layer deposited on the at least partially transparent gate structure of a photosensitive device of my invention.

In a yet further embodiment of my invention which is capable of infrared detection, a pyroelectric material 41 is deposited on the field-effect transistor gate structure. In this embodiment, a change in the pyroelectric properties of the deposited pyroelectric layer alters the degree of inversion of the insulated gate field-effect transistor gate structure, and thus effects the operation of the device. The sensitivity of pyroelectric materials to FIR, when used in this way or other ways which will occur to those having ordinary skill in the art, informed by the present disclosure, results in detection of far infrared radiation.

In accordance with yet another embodiment of my invention, surface states in an insulated gate device of my invention of the kind shown in FIG. 1 can be used to effect channel conductance under operation as an emitter or collector. Also, this surface effect mechanism may be used in certain embodiments of my invention to shift the threshold voltage of the insulated gate field-effect transistor section, and thus to provide insulated gate field-effect transistor threshold photodependence.

It will thus be seen that the objects set forth above, among those made apparent from the preceding description, are efficiently attained, and, since certain changes may be made in the above constructions without departing from the scope of my invention, it is intended that all matter contained in the above description or shown in the accompanying drawings shall be interpreted as illustrative only, and not in a limiting sense. d It is particularly noted that although my invention has been disclosed as embodied in a device in which the sourceless field-effect transistor section 14 is of the MOSFET or insulated gate type, my invention equally embraces embodiments wherein the sourceless field-effect transistor section is of the junction field-effect transistor type, or of the MESFET type. Furthermore, it is to be understood that my invention also embraces devices of the general type described herein in which the sourceless field-effect transistor section is of the non-volatile field-effect transistor type, such as found in MNOS field-effect transistors, or of the buried gate type.

It is also to be understood that the following claims are intended to cover all of the generic and specific features of my invention herein described, and all statements of the scope of my invention which, as a matter of language, might be said to fall therebetween.

Having described my invention, what I claim as new and desire to secure by Letters Patent is:

1. An electrical device, comprising:
    a semiconductor junction structure including a first semiconductor body portion and a second semiconductor body portion and a semiconductor junction between said body portions;
    first contact means for making external circuit connections to a first part of said first semiconductor body portion remote from said semiconductor junction;
    second contact means for making external circuit connections to a second part of said first semiconductor body portion which surrounds and is spaced from said first part;
    a channel region extending between said first and second parts of said first semiconductor body portion;
    gate means confronting substantially all of said channel region, without completely covering both semiconductor body portions, for controlling the flow of current therethrough; and
    third contact means for making external circuit connections to said second body portion,
    further comprising circuit means connected to said contact means whereby said channel region serves as the collector of a bipolar junction transistor arrangement comprising said first and second body portions.

2. An electrical device, comprising:
    a semiconductor junction structure including a first semiconductor body portion and a second semiconductor body portion and a semiconductor junction between said body portions;
    first contact means for making external circuit connections to a first part of said first semiconductor body portion remote from said semiconductor junction;
    second contact means for making external circuit connections to a second part of said first semiconductor body portion which surrounds and is spaced from said first part;
    a channel region extending between said first and second parts of said first semiconductor body portion;
    gate means confronting substantially all of said channel region, without completely covering both semiconductor body portions, for controlling the flow of current therethrough; and
    third contact means for making external circuit connections to said second body portion,
    said gate means being at least partially transparent to radiation of at least some part of the electromagnetic spectrum,
    further comprising circuit means connected to said contact means whereby said channel region serves as the collector of a bipolar junction transistor arrangement comprising said first and second body portions.

3. An electrical device comprising:
    a semiconductor junction structure including a first semiconductor body portion and a second semiconductor body portion and a semiconductor junction between said body portions;
    first contact means for making external circuit connections to a first part of said first semiconductor body portion remote from said semiconductor junction;
    second contact means for making external circuit connections to a second part of said first semiconductor body portion which surrounds and is spaced from said first part;
    a channel region extending between said first and second parts of said first semiconductor body portion;
    gate means confronting substantially all of said channel region, without completely covering both semiconductor body portions, for controlling the flow of current therethrough; and
    third contact means for making external circuit connections to said second body portion,
    a layer of radiation sensitive material confronting said gate means,
    further comprising circuit means connected to said contact means whereby said channel region serves as the collector of a bipolar junction transistor arrangement comprising said first and second body portions.

* * * * *